/ United States Patent /// US 11,256,057 B2
Yan /// Feb. 22, 2022

(54) LENS MODULE WITH ELECTROMAGNETIC PROTHCTION AND ELECTRONIC DEVICE USING THE SAME

(71) Applicant: TRIPLE WIN TECHNOLOGY(SHENZHEN) CO.LTD., Shenzhen (CN)

(72) Inventor: Chun-Yan Yan, Shenzhen (CN)

(73) Assignee: TRIPLE WIN TECHNOLOGY(SHENZHEN) CO. LTD., Shenzhen (CN)

( * ) Notice: Subject to any disclaimer, the term of this patent is extended or adjusted under 35 U.S.C. 154(b) by 107 days.

(21) Appl. No.: 16/680,804

(22) Filed: Nov. 12, 2019

(65) Prior Publication Data

US 2021/0055499 A1    Feb. 25, 2021

(30) Foreign Application Priority Data

Aug. 22, 2019  (CN) .......................... 201921377911.0

(51) Int. Cl.
*H05K 9/00* (2006.01)
*G03B 30/00* (2021.01)
*G02B 7/02* (2021.01)

(52) U.S. Cl.
CPC .............. *G02B 7/02* (2013.01); *G03B 30/00* (2021.01); *H05K 9/0081* (2013.01)

(58) Field of Classification Search
CPC ............................ H05K 9/0007; G03B 30/00
See application file for complete search history.

(56) References Cited

U.S. PATENT DOCUMENTS

| | | | |
|---|---|---|---|
| 2006/0038630 A1* | 2/2006 | Kawaguchi | H05K 1/0233 333/12 |
| 2011/0299262 A1* | 12/2011 | Crotty | H01R 13/6582 361/818 |
| 2016/0178923 A1* | 6/2016 | Hayashi | G02B 27/646 359/557 |
| 2018/0224716 A1* | 8/2018 | Joo | H05K 1/148 |
| 2019/0028620 A1* | 1/2019 | Park | H05K 1/147 |
| 2020/0163258 A1* | 5/2020 | Hatano | H04N 5/2252 |

\* cited by examiner

*Primary Examiner* — Hung V Ngo
(74) *Attorney, Agent, or Firm* — ScienBiziP, P.C.

(57) ABSTRACT

A lens module includes a printed circuit board; a lens mounted on one side of the printed circuit board, and a shielding cover. The shielding cover comprises a cavity. A part of the printed circuit board and a part of the lens are received in the cavity of the shielding cover. The disclosure also relates to an electronic device using the lens module. The lens module can filter the magnetic interference of the external signal and facilitate heat generated by the lens module dissipate outside.

16 Claims, 6 Drawing Sheets

LENS MODULE WITH ELECTROMAGNETIC PROTHCTION AND ELECTRONIC DEVICE USING THE SAME

FIELD

The subject matter of the application generally relates to a lens module.

BACKGROUND

Electronic devices, such as mobile phones, tablet computers or cameras, may have lens modules. Since magnetic interference will affect image quality of the lens module, a strong electromagnetic shielding capability is needed.

BRIEF DESCRIPTION OF THE DRAWINGS

Implementations of the present disclosure will now be described, by way of embodiments, with reference to the attached figures.

DETAILED DESCRIPTION

Figure 1:
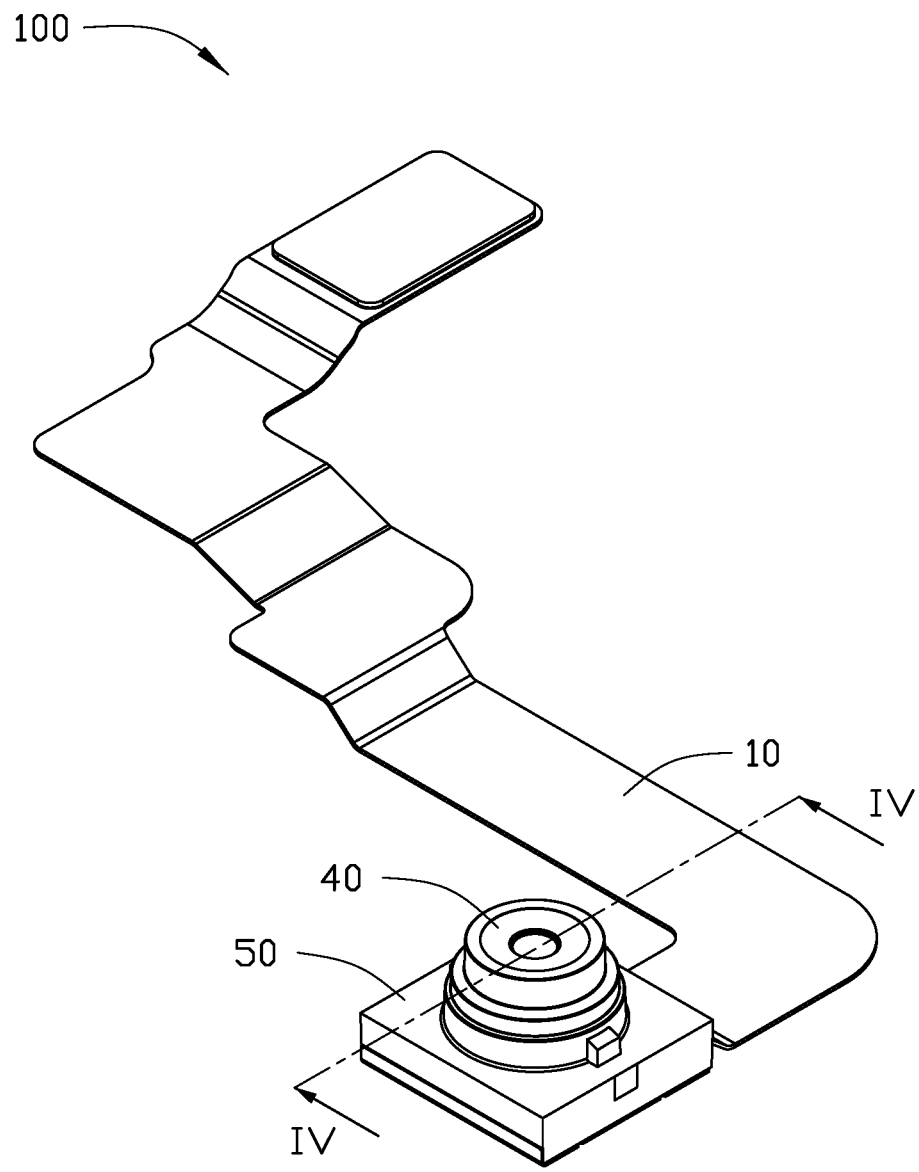
FIG. 1 is a perspective view of an embodiment of a lens module according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain portions may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

FIGS. 1-5 show an embodiment of a lens module 100. The lens module 100 includes a printed circuit board 10, a bearing seat 20, a microscope base 30, a lens 40, and a shielding cover 50. The bearing seat 20 is formed on the printed circuit board 10. The microscope base 30 is formed on the bearing seat 20. The lens 40 is formed on the microscope base 30. The printed circuit board 10, the bearing seat 20, the microscope base 30, and the lens 40 are received in the shielding cover 50 (shown in FIG. 4). That is, the shielding cover 50 partly covers the printed circuit board 10 and the lens, and totally covers the bearing seat 20 and the microscope base 30.

Figure 2:
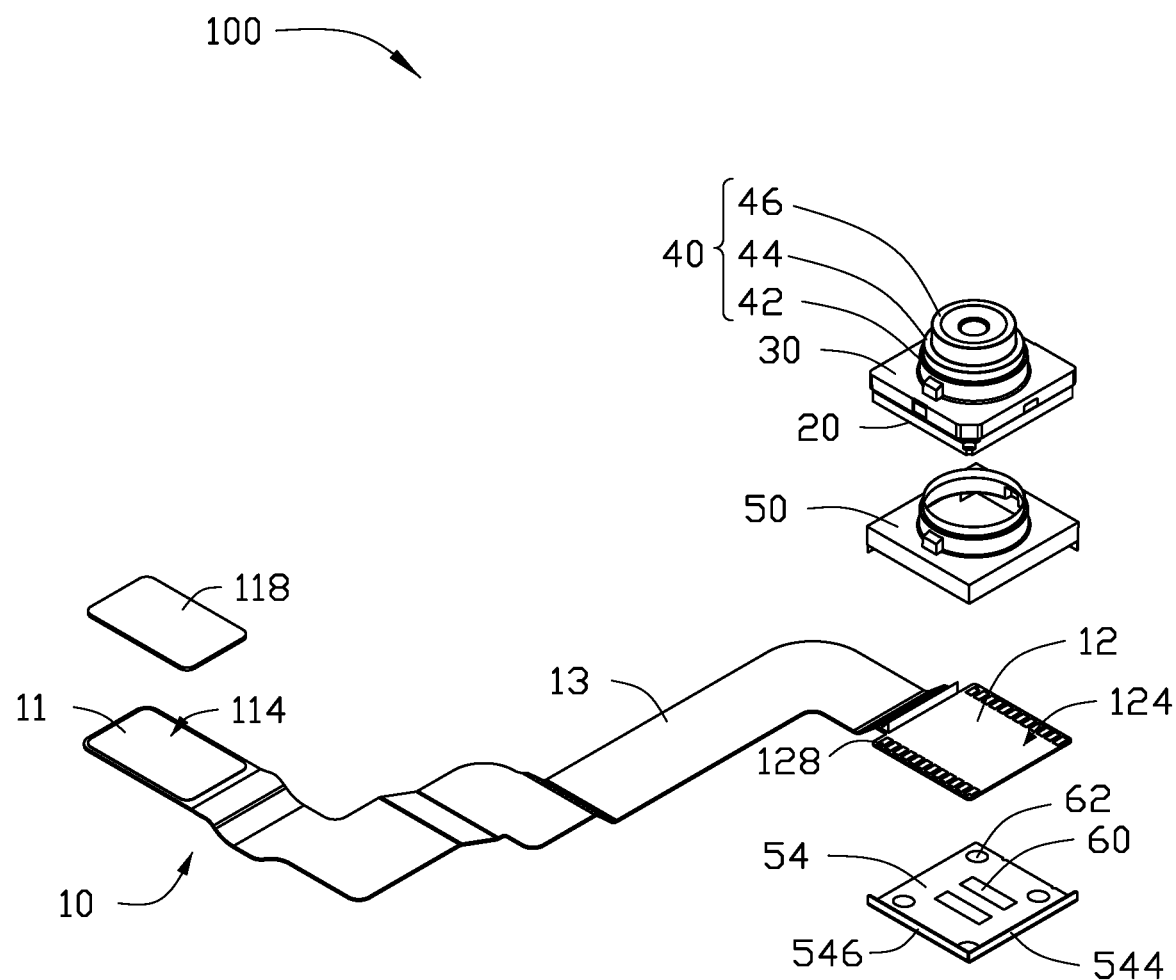
FIG. 2 is an exploded view of the lens module of FIG. 1.
Figure 3:
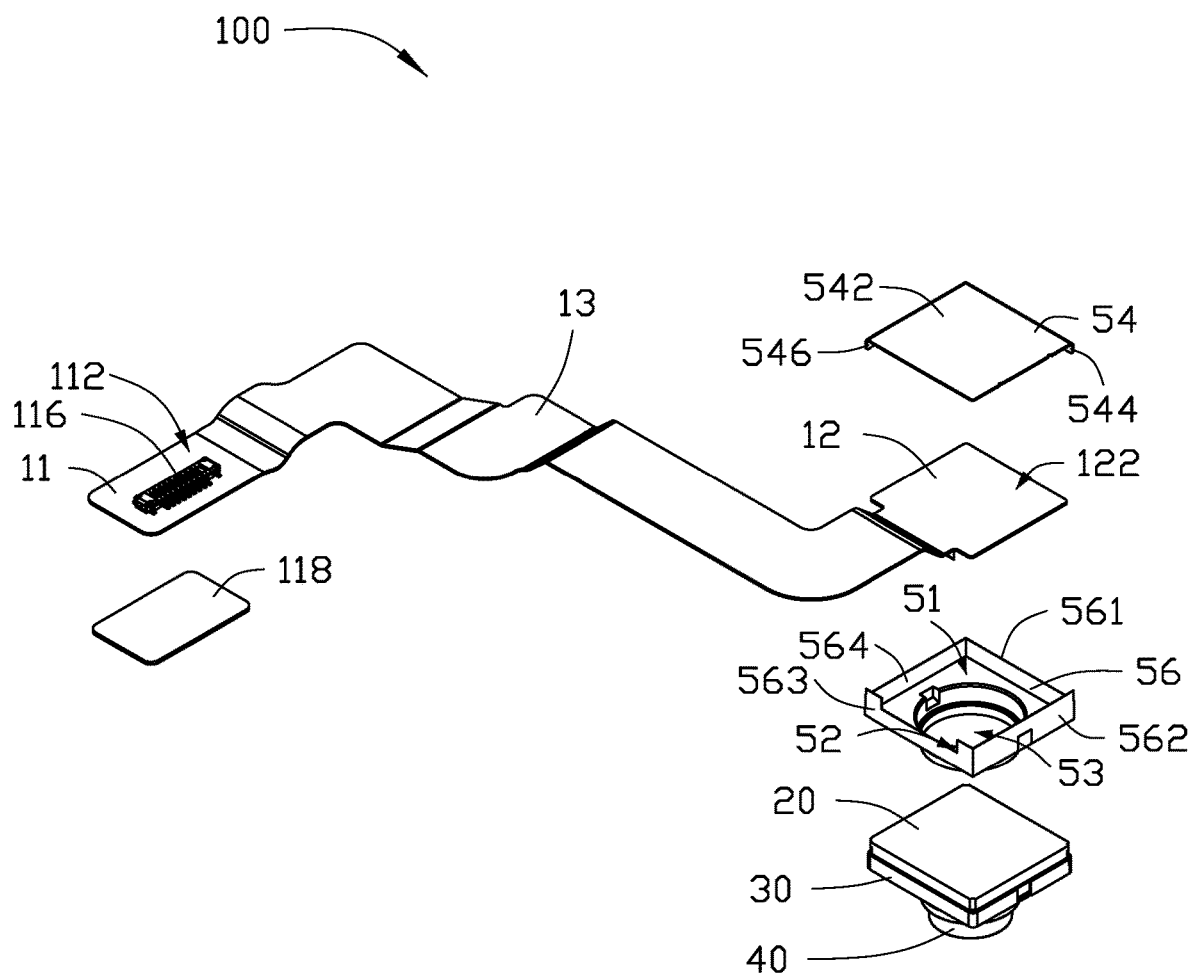
FIG. 3 is an exploded view of the lens module of FIG. 1 from another angle.
Figure 4:
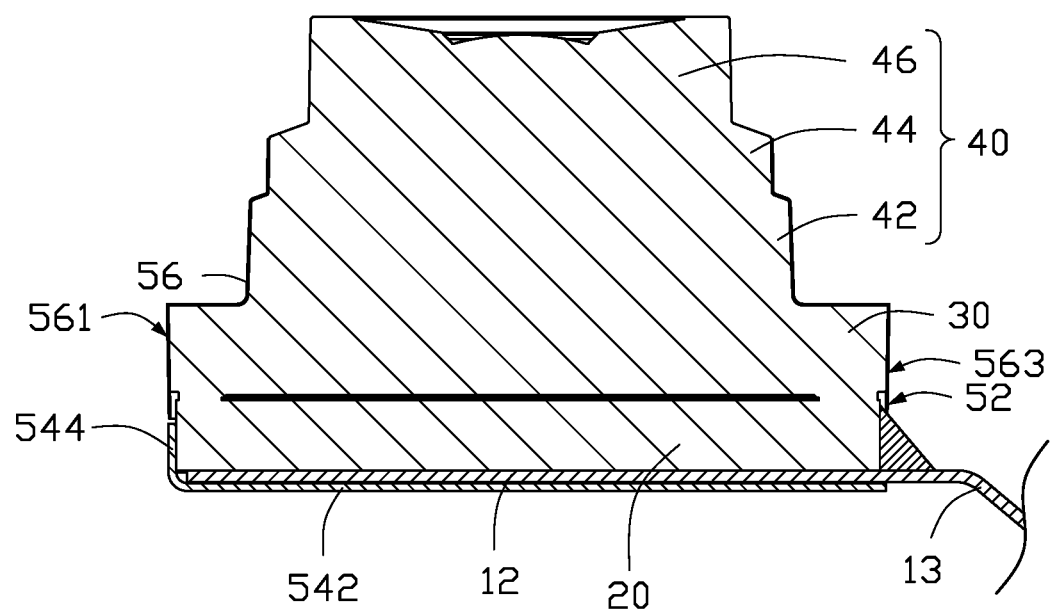
FIG. 4 a cross-section view along line IV-IV of FIG. 1.

In FIGS. 2-3, the printed circuit board 10 may be a flexible printed circuit board, a rigid printed circuit board, a rigid-flex printed circuit board, or the like. In at least one embodiment, the printed circuit board 10 is a rigid-flex printed circuit board.

The printed circuit board 10 includes a first rigid portion 11, a second rigid portion 12, and a flexible portion 13. The flexible portion 13 is located between the first rigid portion 11 and the second rigid portion 12.

The first rigid portion 11 includes a first surface 112 and a second surface 114 opposite to the first surface 112. An electrical connection portion 116 is mounted on the first surface 112. The electrical connection portion 116 may be a connector or an edge connector (gold fingers). The electrical connection portion 116 is used to implement signal transmission between the lens module 100 and the electronic device 200. A reinforcing plate 118 is mounted on the second surface 114. The reinforcing plate 118 is for reinforcing the hardness of the first rigid portion 11. In at least one embodiment, the electrical connection portion 116 can be mounted on the second surface 114 and the electrical connection portion 116 can be mounted on the first surface 112.

The second rigid portion 12 includes a third surface 122 and a fourth surface 124 opposite to the third surface 122. The third surface 122 and the first surface 112 are on a same side of the printed circuit board 10. The fourth surface 124 and the second surface 114 are on a same side of the printed circuit board 10. A sensor (not shown) and a plurality of electronic components 128 are mounted on the fourth surface 124. The electronic components 128 can be components such as a resistor, a capacitor, a diode, a transistor, a relay, or an electrically erasable programmable read only memory (EEPROM).

In at least one embodiment, the bearing seat 20 is mounted on the fourth surface 124. In other embodiment, the bearing seat 20 can be mounted on the third surface 122.

The microscope base 30 is mounted on the bearing seat 20 and opposite to the printed circuit board 10. The microscope base 30 is roughly a rectangular structure.

In at least one embodiment, the microscope base 30 and the lens 40 are an integral structure. The lens 40 includes a first lens portion 42, a second lens portion 44, and a third lens portion 46. The second lens portion 42 connects to the first lens portion 41 and the third lens portion 43. Diameters of the first lens portion 41, the second lens portion 42, and the third lens portion 43 sequentially decrease. The first lens portion 41, the second lens portion 42, and the third lens portion 43 are assembled or integrally formed. In the embodiment, the first lens portion 41, the second lens portion 42, and the third lens portion 43 are integrally formed.

Figure 5:
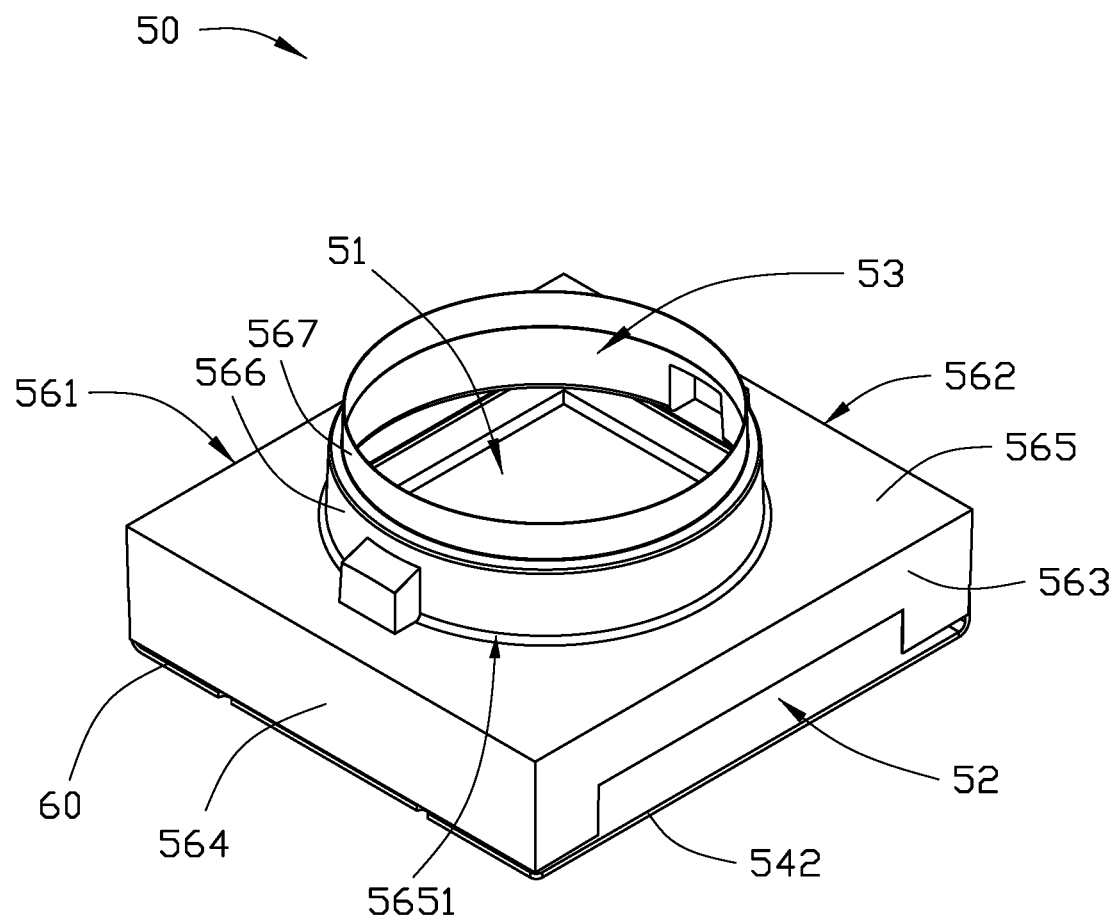
FIG. 5 is a perspective view of a shielding cover of the lens module of FIG. 1.

In FIG. 3 and FIG. 5, the shielding cover 50 includes a first steel sheet 54 and a second steel sheet 56. A cavity 51 is surrounded by the first steel sheet 54 and the second steel sheet 56. The shielding cover 50 further includes a first opening 52 and a second opening 53. A part of the circuit board 10, the bearing seat 20, the microscope base 30 and a part of the lens 40 are received in the cavity 51.

In at least one embodiment, the first steel sheet 54 includes a bottom plate 542, a first baffle portion 544, and a second baffle portion 546. The bottom plate 542 is substantially rectangular. The bottom plate 542 is slightly larger in size than the second rigid portion 12. The first baffle portion 544 and the second baffle portion 546 are vertically formed on the bottom plate 542. The first baffle portion 544 and the second baffle portion 546 are formed on two sides of the bottom plate 542. The first baffle portion 544 is connected to the second baffle portion 546.

The second steel sheet 56 includes a third baffle portion 561, a fourth baffle portion 562, a fifth baffle portion 563, a sixth baffle portion 564, a top plate 565, a first side wall 566, and a second side wall 567. The first opening 52 is defined in the fifth baffle portion 563. The top plate 565 is hollow and is rectangular. A through hole 5651 is defined in the top plate 565. The third baffle portion 561, the fourth baffle portion 562, the fifth baffle portion 563, and the sixth baffle portion 564 are sequentially connected to each other end to end and vertically formed on the same side of the top plate 565. In at least one embodiment, the third baffle portion 561, the fourth baffle portion 562, the fifth baffle portion 563, and the sixth baffle portion 564 are perpendicular to the top plate 565 and formed around the top plate 565. The third baffle portion 561, the fourth baffle portion 562, the fifth baffle portion 563, and the sixth baffle portion 564 extend outside from the top plate 565. The first side wall 566 is formed on the top plate 565 around the through hole 5651. The second side wall 567 is formed on the first side wall 566. The first side wall 566 and the third baffle portion 561 are on two opposite surfaces of the top plate 565. The first side wall 566 encloses a cylinder. The second side wall 567 encloses a cylinder and forms the second opening 53. The cylinder enclosed by the second side surface 567 has a diameter smaller than a diameter of the cylinder enclosed by the first side wall 566.

In FIGS. 2-5, when the first steel sheet 54 is covered with the second steel sheet 56, the third flap portion 561 faces the first flap portion 544, the fourth flap portion 562 faces the second baffle portion 546, the fifth baffle portion 563 and the sixth baffle portion 564 are connected to the bottom plate 542, and the first opening 52 faces the bottom plate 542. The second rigid portion 12 of the circuit board 10 is received in the cavity 51 and mounted on the bottom plate 542. The flexible portion 13 protrudes from the cavity 51. The first rigid portion 11 connected to the flexible portion 13 protrudes from the cavity 51, too. The bearing seat 20, the microscope base 30, the first lens portion 42, and the second lens portion 44 are received in the cavity 51. The first lens portion 42 is received in the cylinder enclosed by the first side wall 566. The second lens portion 44 is received in the cylinder enclosed by the second side wall 567. The third lens portion 46 protrudes from the second opening 53.

The first steel sheet 54 is electrically connected to the printed circuit board 10. In at least one embodiment, the first steel sheet 54 is electrically connected to the printed circuit board 10 by a conductive adhesive 60 formed on the bottom plate 542 in FIG. 2. The first steel sheet 54 is connected to the second steel sheet 56, thereby electrically connecting the shielded cover 50 and the printed circuit board 10. When the lens module 100 is in use, the magnetic interference of the external signal is filtered by the shielding cover 50. The shielding cover 50 further can facilitate heat generated by the lens module 100 dissipate outside. The shielding cover 50 further has the function of supporting the lens module 100.

Further, at least one adhesive 62 is formed between the first steel sheet 54 and the second rigid portion 12 to fix the first steel sheet 54 and the second rigid portion 12.

In other embodiments, the shield 50 includes a first steel sheet 54 and a second steel sheet 56. The first steel sheet 54 and the second steel sheet 56 are mutually symmetrical structures. The first steel sheet 54 and the second steel sheet 56 are combined with each other to form a shielding cover 50 including the first opening 52 and the second opening 53.

It can be understood that a shape and a size of the shielding cover 50 vary with an overall shape and a size of the printed circuit board 10, the bearing seat 20, the microscope base 30, and the lens 40 after assembly, and are not limited to the shape and size as described above.

Figure 6:
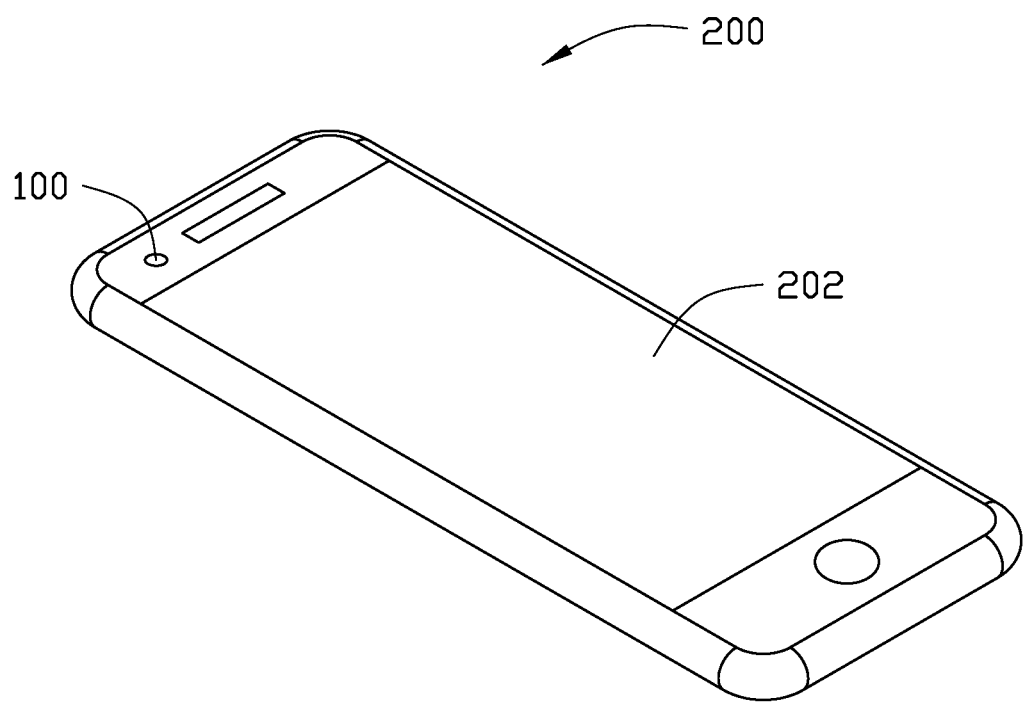
FIG. 6 is a perspective view of an electronic device.

FIG. 6 shows an embodiment of an electronic device 200. The electronic device 200 includes a body 202 and the lens module 100 mounted in the body 202. The electronic device 200 may be a smart phone, a tablet computer, or the like. In at least one embodiment, the electronic device 200 is a smart phone.

With the embodiments described above, the shielding cover 50 can filter the magnetic interference of the external signal, facilitate heat generated by the lens module 100 dissipate outside, and support the lens module 100.

The embodiments shown and described above are only examples. Many details are often found in the art such as the other features of a lens module and an electronic device using the lens module. Therefore, many such details are neither shown nor described. Even though numerous characteristics and advantages of the present disclosure have been positioned forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims. It will therefore be appreciated that the embodiments described above can be modified within the scope of the claims.

What is claimed is:

1. A lens module comprising:
a printed circuit board;
a lens mounted on a side of the printed circuit board; and
a shielding cover, wherein the shielding cover further comprises a first opening and a second opening, a remaining portion of the printed circuit board protrudes from the first opening, a remaining portion of the lens protrudes from the second opening; and a remaining portion means a portion which is not received in the cavity, wherein the shielding cover comprises a cavity, a portion of the printed circuit board and a portion of the lens are received in the cavity, the shielding cover further comprises a first steel sheet and a second steel sheet, the cavity is surrounded by the first steel sheet and the second steel sheet, and the printed circuit board received in the cavity is formed on and connected to the first steel sheet.

2. The lens module of claim 1, wherein the first steel sheet comprises a bottom plate, a first baffle portion, and a second baffle portion, the first baffle portion and the second baffle portion are vertically formed on the bottom plate; the printed circuit board received in the cavity is formed on and connected to the bottom plate.

3. The lens module of claim 2, wherein the second steel sheet comprises a third baffle portion, a fourth baffle portion, a fifth baffle portion, a sixth baffle portion and a top plate; the third baffle portion, the fourth baffle portion, the fifth baffle portion, and the sixth baffle portion are connected to each other end to end and formed on the top plate to form the cavity with the bottom plate, the first baffle portion, and the second baffle portion; and the first opening is defined in the fifth baffle portion.

4. The lens module of claim 3, wherein the second steel sheet further comprises a first side wall and a second side wall; a through hole is defined in the top plate; the first side wall is around the through hole and formed on the top plate; the first side wall and the third baffle portion are formed on two opposite surface of the top plate; the second side wall is formed on the first side wall; the first side wall encloses a cylinder, the second side wall encloses a cylinder and forms the second opening.

5. The lens module of claim 3, wherein the third flap portion faces the first flap portion, the fourth flap portion faces the second baffle portion, the fifth baffle portion and the sixth baffle portion are connected to the bottom plate, and the first opening faces the bottom plate.

6. The lens module of claim 2, wherein the printed circuit board comprises a first rigid portion, a second rigid portion, and a flexible portion; the flexible portion is located between the first rigid portion and the second rigid portion; the second rigid portion is received in the cavity and connected to the bottom plate; the flexible portion protrudes from the first opening.

7. The lens module of claim 6, wherein the first steel sheet is fixed on the second rigid portion by at least one adhesive.

8. The lens module of claim 1, wherein the printed circuit board is connected to the first steel sheet by a conductive adhesive formed on the bottom plate.

9. An electronic device, comprising:
a body;
a lens module mounted in the body comprising:
 a printed circuit board;
 a lens mounted on a side of the printed circuit board; and
 a shielding cover, wherein the shielding cover further comprises a first opening and a second opening, a remaining portion of the printed circuit board protrudes from the first opening, a remaining portion of the lens protrudes from the second opening; and a remaining portion means a portion which is not received in the cavity, wherein the shielding cover comprises a cavity, a portion of the printed circuit board and a portion of the lens are received in the cavity of the shielding cover, the shielding cover further comprises a first steel sheet and a second steel sheet, the cavity is surrounded by the first steel sheet and the second steel sheet, and the printed circuit board received in the cavity is formed on and connected to the first steel sheet.

10. The electronic device of claim 9, wherein the first steel sheet comprises a bottom plate, a first baffle portion, and a second baffle portion, the first baffle portion and the second baffle portion are vertically formed on the bottom plate; the printed circuit board received in the cavity is formed on and connected to the bottom plate.

11. The electronic device of claim 10, wherein the second steel sheet comprises a third baffle portion, a fourth baffle portion, a fifth baffle portion, a sixth baffle portion and a top plate; the third baffle portion, the fourth baffle portion, the fifth baffle portion, and the sixth baffle portion are connected to each other end to end and formed on the top plate to form the cavity with the bottom plate, the first baffle portion, and the second baffle portion; and the first opening is defined in the fifth baffle portion.

12. The electronic device of claim 11, wherein the second steel sheet further comprises a first side wall and a second side wall; a through hole is defined in the top plate; the first side wall is around the through hole and formed on the top plate; the first side wall and the third baffle portion are formed on two opposite surface of the top plate; the second side wall is formed on the first side wall; the first side wall encloses a cylinder, the second side wall encloses a cylinder and forms the second opening.

13. The electronic device of claim 11, wherein the third flap portion faces the first flap portion, the fourth flap portion faces the second baffle portion, the fifth baffle portion and the sixth baffle portion are connected to the bottom plate, and the first opening faces the bottom plate.

14. The electronic device of claim 10, wherein the printed circuit board comprises a first rigid portion, a second rigid portion, and a flexible portion; the flexible portion is located between the first rigid portion and the second rigid portion; the second rigid portion is received in the cavity and connected to the bottom plate; the flexible portion protrudes from the first opening.

15. The electronic device of claim 14, wherein the first steel sheet is fixed on the second rigid portion by at least one adhesive.

16. The electronic device of claim 9, wherein the printed circuit board is connected to the first steel sheet by a conductive adhesive formed on the bottom plate.

* * * * *